(12) United States Patent
Saman et al.

(10) Patent No.: US 8,058,926 B2
(45) Date of Patent: Nov. 15, 2011

(54) AMPLIFIER INPUT SWITCH CONFIGURATION WITH IMPROVED PSRR

(75) Inventors: Hynek Saman, Beroun (CZ); Peter Murin, Polltar (SK); Martin Boksa, Svidnik (SK); Pavel Panus, Prague (CZ)

(73) Assignees: STMicroelectronics Design and Application s.r.o., Prague (CS); STMicroelectronics S.A., Montrouge (FR)

( * ) Notice: Subject to any disclaimer, the term of this patent is extended or adjusted under 35 U.S.C. 154(b) by 1242 days.

(21) Appl. No.: 11/655,727

(22) Filed: Jan. 19, 2007

(65) Prior Publication Data

US 2007/0170976 A1   Jul. 26, 2007

(30) Foreign Application Priority Data

Jan. 20, 2006  (EP) ..................................... 06100662

(51) Int. Cl.
*G06G 7/12* (2006.01)
(52) U.S. Cl. ........................ 327/560; 327/561; 330/284
(58) Field of Classification Search .................. 327/560, 327/561; 330/284
See application file for complete search history.

(56) References Cited

U.S. PATENT DOCUMENTS

| | | | |
|---|---|---|---|
| 4,641,105 A | 2/1987 | Albaugh et al. | |
| 5,554,951 A | 9/1996 | Gough | |
| 5,796,300 A | 8/1998 | Morgan | |
| 5,912,584 A | 6/1999 | Iizuka | |
| 5,982,230 A | 11/1999 | MacBeth | |
| 6,043,689 A * | 3/2000 | Sheets et al. | 327/108 |
| 6,078,210 A | 6/2000 | Uchida et al. | |
| 6,265,914 B1 * | 7/2001 | Randhawa | 327/108 |
| 6,304,120 B1 * | 10/2001 | Taito | 327/170 |
| 6,433,632 B1 | 8/2002 | Nakamura et al. | |
| 6,518,804 B2 * | 2/2003 | Kawagoshi et al. | 327/112 |
| 7,053,661 B1 * | 5/2006 | Butka | 326/87 |
| 2004/0036520 A1 | 2/2004 | Anders et al. | |
| 2004/0212427 A1 | 10/2004 | Forel et al. | |
| 2005/0110477 A1 | 5/2005 | Mauthe | |

FOREIGN PATENT DOCUMENTS

WO   WO 2005/006760 A2   7/2005

OTHER PUBLICATIONS

European Search Report from European Patent Application 06100662.3, filed Jan. 20, 2006.
European Search Report from European Patent Application 06100667.2, filed Jan. 20, 2006.

* cited by examiner

*Primary Examiner* — Kenneth B. Wells
(74) *Attorney, Agent, or Firm* — Lisa K. Jorgenson; James H. Morris; Wolf, Greenfield & Sacks, P.C.

(57) ABSTRACT

A switch including a first transistor including a first main terminal connected to a first switch node, a second main terminal connected to a second switch node and a control terminal, the second switch node being connected to a first clean voltage supply, and first control circuitry connected to the control terminal of the first transistor, including a first node connected to the first clean voltage supply, a second node connected to a second voltage level, and a control input node for receiving a first input control signal variable between a supply voltage level and a third voltage level, the first control means arranged to selectively connect the control terminal of the first transistor to one of the first node and the second node based on the first input control signal.

19 Claims, 5 Drawing Sheets

AMPLIFIER INPUT SWITCH CONFIGURATION WITH IMPROVED PSRR

BACKGROUND OF THE INVENTION

1. Field of the Invention

The present invention relates to an improved switch configuration, and in particular an improved switch configuration having an improved power supply rejection ratio (PSRR).

2. Discussion of the Related Art

In order to reduce noise at the output of an amplification system, it is desirable to increase the PSRR (Power Supply Rejection Ratio). The PSRR is a measure of the influence of power supply ripple at the output of the system.

Referring to FIG. 1, a switch 2 has one input node 21 and first and second output nodes 23, 25. The switch operates in one of two states, a first in which the input node 21 is connected to the first output node 23, isolating the input from the second output node 25, and a second state in which the input node 21 is connected to the second output node 25 and is isolated from the first output node 23.

Switch 2 can be implemented using MOSFETs (Metal Oxide Semiconductor Field-Effect Transistors) as shown in FIG. 2. With reference to FIG. 2, the switch 2 is shown comprising the input node 21, the first output node 23 and the second output node 25. Switch 2 further comprises a first P-channel MOS transistor 22, connected in parallel with a first N-channel MOS transistor 24, and a second P-channel MOS transistor 26 connected in parallel with a second N-channel MOS transistor 28. The drains of the first and second NMOS transistors 24 and 28 are connected to input node 21, and their sources are connected to first output node 23 and the second output node 25 respectively. The sources of the first and second PMOS transistors 22 and 26 are connected to input node 21, and their drains are connected to the first output node 23 and the second output node 25 respectively. A first switch control signal on a line 30 is connected to the gate node of the first PMOS transistor and second NMOS transistor 22 and 28. A second switch control signal on line 32, which is the inverse of the first switch control signal, is connected to the gates of the second NMOS transistor and first PMOS transistors 24 and 26.

As described above, switch 2 operates in one of two states. In the first state the first switch control signal on line 30 is high and the second switch control signal on line 32 is low, thus turning off first PMOS transistor and NMOS transistors 22 and 24, and turning on second PMOS transistor and NMOS transistors 26 and 28, thereby connecting input node 21 to the second output node 25. In a second state, the first switch control signal on line 30 is low and the second switch control signal on line 32 high, thus turning on first PMOS transistor and NMOS transistors 22 and 24, and turning off second PMOS transistor and NMOS transistors 26 and 28, thereby connecting the input node 21 to the first output node 23.

Switch 2 is disadvantageous due to the parasitic capacitances present between the nodes of the N and P channel MOS transistors. Referring to PMOS transistor 22, a parasitic capacitance 36 is present between the well 34 of PMOS transistor 22 and its drain node, a parasitic capacitance 38 is present between the drain node and the gate node of transistor 22, a parasitic capacitance 40 is present between the gate node and the source node of transistor 22, and a parasitic capacitance 42 is present between the source node and the well 34. NMOS transistor 24 comprises parasitic capacitances 44 and 46 between its gate node and its drain and source respectively. PMOS transistor 26 comprises a well 48, and the same parasitic capacitances, labeled 50 to 56, between adjacent nodes as described above for PMOS transistor 22. NMOS transistor 28 comprises parasitic capacitances 58 and 60 between its gate node and its drain and source respectively.

Combinations of these parasitic capacitances will be present at the input node 21 or the first and second output nodes 23, 25 of the switch when it is in either of the first or second states. Wells 34 and 48 of PMOS transistors 22 and 26 are connected to the noisy supply voltage $V_{dd}$, and one of the first and second switch control signals on lines 30 and 32 will always be connected to the noisy supply voltage $V_{dd}$ in each state of the switch, and thus due to the parasitic capacitances, any ripple in this supply voltage will be present at the input/output nodes of the switch. Particularly in situations in which this switch is used in amplifying circuit arrangements, and the nodes of the switch are connected to inputs of the amplifier, this will result in noise at the output of the system, which is clearly disadvantageous. A high PSRR should therefore be provided for the amplifier system.

SUMMARY OF THE INVENTION

It is an aim of embodiments of the present invention to at least partially overcome the problems in the prior art circuitry described above.

According to a first aspect of the present invention there is provided a switch comprising a first transistor comprising a first main terminal connected to a first switch node, a second main terminal connected to a second switch node and a control terminal, the second switch node being connected to a first clean voltage supply, and first control means connected to said control terminal of said first transistor, comprising a first node connected to said first clean voltage supply, a second node connected to a second voltage level, and a control input node for receiving a first input control signal variable between a supply voltage level and a third voltage level, said first control means arranged to selectively connect said control terminal of said first transistor to one of said first node and said second node based on said first input control signal.

According to a further aspect of the present invention there is provided an amplifying circuit comprising an amplifier, and at least one selectable input path comprising a resistor and the switch described above. According to a further aspect an audio device is provided comprising the switch as described above.

According to yet a further aspect of the present invention, there is provided a method of controlling a switch comprising supplying a first input control signal at one of a supply voltage level and a second voltage level to a control input node of a first control means; and based on the voltage level of the first input control signal, selectively connecting a control terminal of a first transistor to one of a first clean voltage supply and a third voltage level, said first transistor comprising a first main terminal connected to a first switch node, a second main terminal connected to a second switch node and a control terminal.

Further objects, features, and advantages of the present invention will become apparent from the following detailed description of exemplary preferred embodiments, when considered with the accompanying figures.

DETAILED DESCRIPTION

Figure 1:
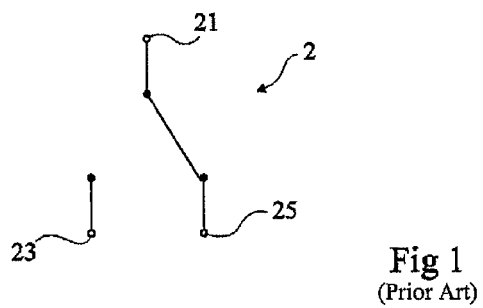
FIG. 1, discussed above, illustrates a known switch.
Figure 2:
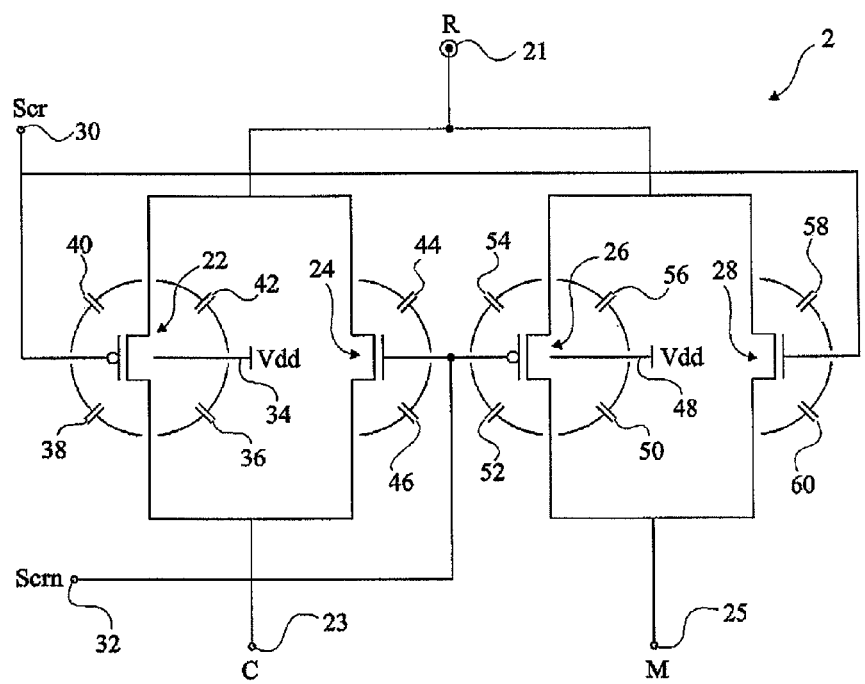
FIG. 2 illustrates an implementation of the switch of FIG. 1 using MOSFETs.
Figure 3:
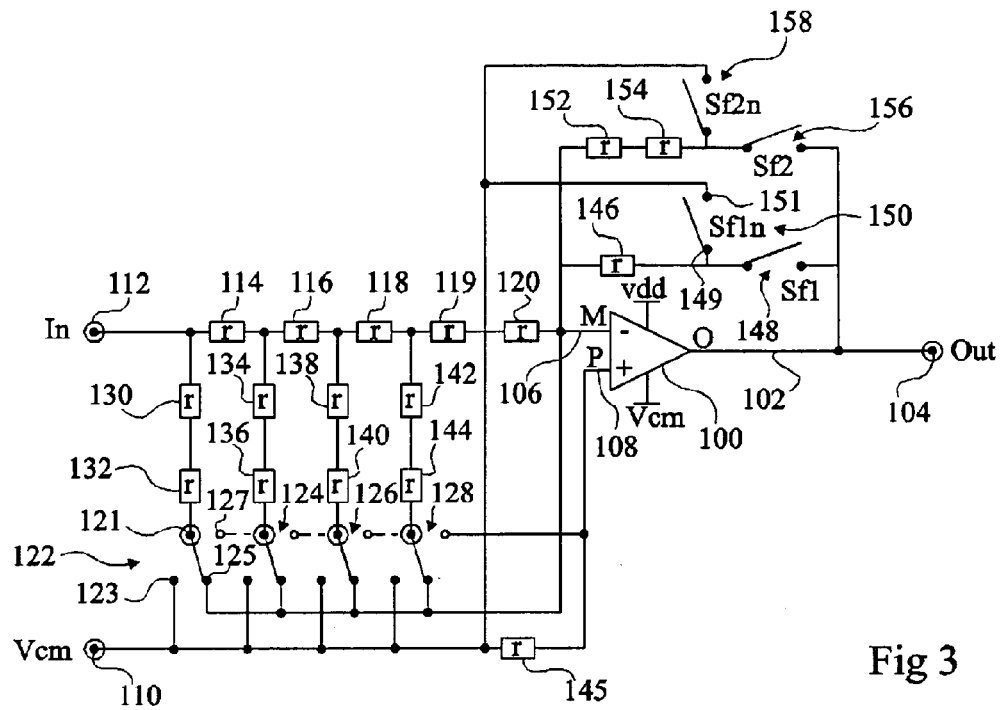
FIG. 3 illustrates an inversing amplifying circuit comprising a number of switches according to the present invention.

FIG. 3 illustrates a variable gain inverting amplifier. The amplifier comprises an operational amplifier 100 having an output 102 connected to an output node of the circuit 104. The operational amplifier 100 comprises first and second differential input nodes, the first being a negative input node 106 and the second being a positive input node 108. The positive input node 108 is connected to a common mode voltage ($V_{cm}$) reference node 110 of the circuit via a resistor 145. $V_{cm}$ in this example is half the supply voltage and is a clean voltage supply, meaning that it is buffered such that supply voltage ripples are reduced or eliminated at node 110, as will be explained in more detail herein below.

The amplifying circuit comprises an input node 112, which is connected to the negative input node 106 of the operational amplifier via five resistors 114, 116, 118, 119 and 120 connected in series. The input node 112 is also connected to the input terminal 121 of a first switch 122 via a pair of resistors 130, 132 connected in series. Likewise, the nodes between resistors 114 and 116, between resistors 116 and 118, and between resistors 118 and 119, are each connected to the input terminals of second, third and fourth switches 124, 126 and 128 respectively via respective pairs of resistors 134 and 136, 138 and 140, and 142 and 144 connected in series.

The first switch 122 further comprises first and second output terminals 123, 125, the first output terminal 123 being connected to reference voltage $V_{cm}$ at node 110, and the second output terminal being connected to the negative input node 106 of the operational amplifier 100. The first switch 122 also comprises a further terminal 127 which is connected to the positive input node 108 of the operational amplifier, and which will be explained in more detail below.

As with the first switch 122, the second, third and fourth switches 124 to 128 each also comprise first and second output nodes, the first output node being connected to $V_{cm}$ at node 110, and the second output node being connected to the negative input terminal 106. They each also comprise a further terminal connected to node 108.

The first, second, third and fourth switches thus allow their input node to be connected to either to $V_{cm}$ or to node 106. The resistors 114 to 120 and 130 to 144 form an R2R network, allowing the current through the feedback path of the operational amplifier circuit to be adjusted by control of the switches. The input resistance of the R2R network visible from the input node will be constant, irrespective of the configuration of the switches, however the switches determine how much of the input current is directed via node 106, and how much is directed to $V_{cm}$. In particular the R2R network allows the input current to node 106 to be adjusted by varying amounts.

For example, by controlling switch 122 to connect node 121 to node 106, the input current to the amplifier circuit is increased by a relatively high amount, and then by connecting each of the second, third and fourth switches 124 to 128, the input current is increased by progressively smaller amounts, due to the additional resistors 114, 116 and 118 in the input path. The resistors are all shown as having a resistance value r, which could be the same for all the resistors, or could be different. The resistance values chosen will depend on the requirements of the circuit.

Two feedback paths are provided from the output 102 of the operational amplifier 100 to the input node 106 of the operational amplifier. A first feedback path comprises a feedback resistor 146 in series with a first feedback switch 148, switch 148 controlling when the first feedback path is connected. A further switch 150 selectively connects the node between feedback resistor 146 and switch 148 to $V_{cm}$ at node 110. Switch 150 comprises an input node 149 connected to the node between the feedback resistor 146 and switch 148, and an output node 151 connected to $V_{cm}$.

A second feedback path comprises first and second resistors 152 and 154 connected in series with a second feedback switch 156, switch 156 controlling when the second feedback path is connected. A further switch 158 is provided selectively connecting the node between resistor 154 and switch 156 to $V_{cm}$ at node 110.

In operation, the gain of the amplifier can be altered by adjusting the input resistance of the system by controlling the first, second, third and fourth switches 122 to 128, or by adjusting the feedback resistance of the amplifier, by selecting one or both of the first and second feedback paths.

Switches 150 and 158 are provided to reduce the effect of parasitic capacitances of the feedback switches 148 and 156 at the input node 106, as will now be explained in more detail herein below.

The feedback resistors 146, 152 and 154 in the feedback path of the amplifier allow three different values of the feedback resistance to be selected, either or both feedback paths being selectable, however according to the present embodiment the feedback paths are not selected together. The first feedback path with resistor 146 can be selected alone by connecting switch 148, and disconnecting switch 150. In this state switch 156 is also disconnected to disconnect the second feedback path. However, with switch 156 in open circuit, a parasitic capacitance of the switch will be present at the junction between resistor 154 and switch 156, which will affect the negative input node 106 of the amplifier. When switch 156 is open, this node is therefore connected to $V_{cm}$ at node 110 via switch 158.

In an alternative mode, only the second feedback path is connected, providing a feedback resistance equal to the resistance of resistors 152 and 154 in series. For this, switches 148 and 158 are left in open circuit, disconnecting the first feedback path, and disconnecting the node between switches 156 and resistor 154 from $V_{cm}$. The node between resistor 146 and switch 148 is connected to $V_{cm}$ by closing switch 150. This prevents the parasitic capacitances in switch 148 affecting the negative input terminal 106 of the operational amplifier.

Figure 4:
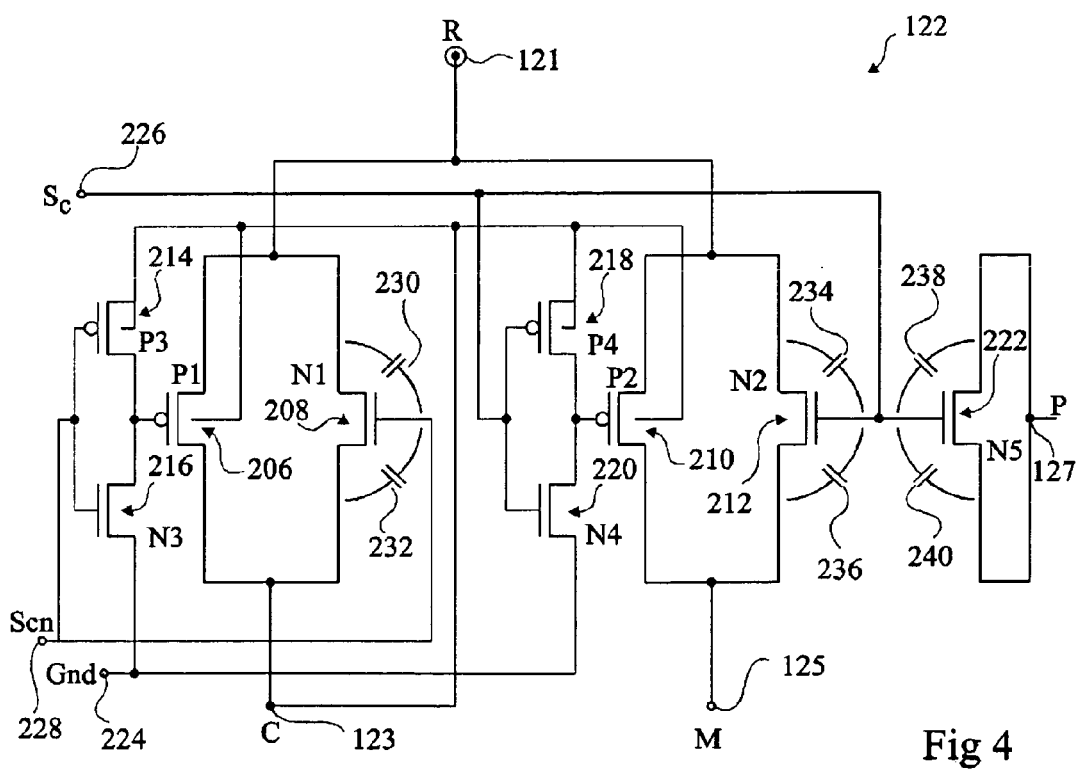
FIG. 4 illustrates one of the switches of FIG. 3 in more detail according to an embodiment of the present invention.

The first, second, third and fourth switches 122 to 128 are identical to each other and are designed so as to reduce the effect of parasitic capacitances around the nodes of the MOSFET in the circuit, and thereby reduce the PSRR at the output of the circuit. FIG. 4 illustrates the first switch 122 in more detail.

Referring to FIG. 4, switch 122 comprises input node 121, which is connected to the input node 112 of the amplifier system via the R2R network as discussed above in relation to FIG. 3. Switch 122 further comprises first output node 123, which is connected to voltage reference $V_{cm}$ at node 110 in FIG. 3, and a second output node 125 connected to the negative input node 106 of the operational amplifier of FIG. 3, as also described above.

Switch 122 comprises a P-channel MOS transistor 206 and an N-channel MOS transistor 208 connected in parallel, with a first source/drain node of each transistor connected to the input node 121, and a second source/drain node of each transistor connected to the first output node 123. The circuit further comprises a P-channel MOS transistor 210 and an N-channel MOS transistor 212 connected in parallel, with a first source/drain node of each transistor connected to the input node 121, and a second source/drain node of each transistor connected to the second output node 125.

A further P-channel MOS transistor 214 and an N-channel MOS transistor 216 are provided connected in series, and a further P-channel MOS transistor 218 and an N-channel MOS transistor 220 are also provided connected in series. An N-channel MOS transistor 222 is provided with its source and drain connected together to node 127, which as described in relation to FIG. 3 is connected to the positive input node 108 of the operational amplifier.

The sources of NMOS transistors 216 and 220 are connected to ground (0V) at a node 224. The sources of PMOS transistors 214 and 218 are connected to the first output node 123, which is connected to $V_{cm}$ as explained above. The drain of PMOS transistor 214 and the drain of NMOS transistor 216 are connected together at a node which is also connected to the gate of PMOS transistor 206. In a similar fashion, the drain of PMOS transistor 218 and the drain of NMOS transistor 220 are connected together at a node which is also connected to the gate of PMOS transistor 210. The gates of NMOS transistor 212 and NMOS transistor 222 are connected together, and are connected to a line 226 for receiving a first switch control input signal. Line 226 is also connected to the gate terminals of the PMOS transistor 218 and NMOS transistor 220. A second switch control input signal is provided on line 228, which is the inverse of the signal on line 226, and which is connected to the gate inputs of PMOS transistor 214 and NMOS transistor 218, and also to the gate input of NMOS transistor 208.

The well connection of each of the PMOS transistors 214, 206, 218 and 210 are all connected to the first output node 123.

Due to the circuit arrangement of FIG. 4, the only parasitic capacitances that affect the circuit input/output nodes are the parasitic capacitances 230, 232 between the gate and the drain and source of NMOS transistor 208, and the parasitic capacitances 234, 236, 238, 240 between the gates and drains and sources of NMOS transistors 212 and 222.

In operation, the switch 122 of FIG. 4 operates as follows. The input node 121 is connected to the second output node 125 when the first input control signal on line 226 is high, at the supply voltage $V_{dd}$, and the second input control signal on line 228 is low, in this example at 0V. This results in the second NMOS transistor 212 being switched on, providing a conduction path between node 121 to node 125. The parasitic capacitances 234 and 236 between the gate of NMOS transistor 212 and its source and drain in this state are to some extent cancelled by the equivalent parasitic capacitances 238 and 240 between the gate node and the source and drain of NMOS transistor 222 which is connected to the positive input node of the operational amplifier 100. The extent of cancellation will depend on the impedance visible from the positive and negative inputs of the amplifier, better cancellation being achieved if these impedances are matched. However, as the resistance of the R2R network is variable, and resistor 145 is fixed, the resistances will not always be matched. In alternative embodiments the resistor 145 could be provided by an R2R network similar to the R2R network at the negative input, enabling these resistances to be matched.

Signal 226 will also turn on NMOS transistor 220 thus connecting the gate node of PMOS transistor 210 to ground node 224, and at the same time, will turn off PMOS transistor 218. The low input at the gate of PMOS transistor 210 will turn on this transistor, providing a second conduction path between node 121 and node 125.

The low signal of input signal 228 will turn off NMOS transistor 208, and as the control signal is low, the parasitic capacitances 230 and 232 between the nodes of this transistor will have no significant voltage across them. In order to turn off PMOS transistor 206, its gate is connected to the node between PMOS transistor 214 and NMOS transistor 216. Due to the low input signal on line 228, PMOS transistor 214 will be conducting, whilst NMOS transistor 216 will be turned off. Thus the gate of PMOS transistor 206 is connected via PMOS transistor 214 to the first output node 123, and in particular to the clean reference voltage $V_{cm}$.

In the alternative mode of operation, in order to connect input node 121 to the first output node, the control signal on line 226 is low, thereby turning off NMOS transistors 212 and 222, and controlling transistors 218 and 220 to connect the control terminal of PMOS transistor 210 to $V_{cm}$ via the first output node 123. Furthermore, the control signal on line 228 is high, turning on NMOS transistor 208, and controlling transistors 214 and 216 to connect the control terminal of PMOS transistor 206 to ground, thereby turning on PMOS transistor 206.

Referring again to FIG. 3, as explained above, switches 150 and 158 allow the nodes between the feedback resistors and the feedback switches to be connected to $V_{cm}$, thereby preventing voltage ripple due to the parasitic capacitance of switches 156 and 148 at this node when these switches are off. Switches 150 and 158 are identical to each other, and FIG. 5A shows switch 150 in more detail.

Figure 5A:
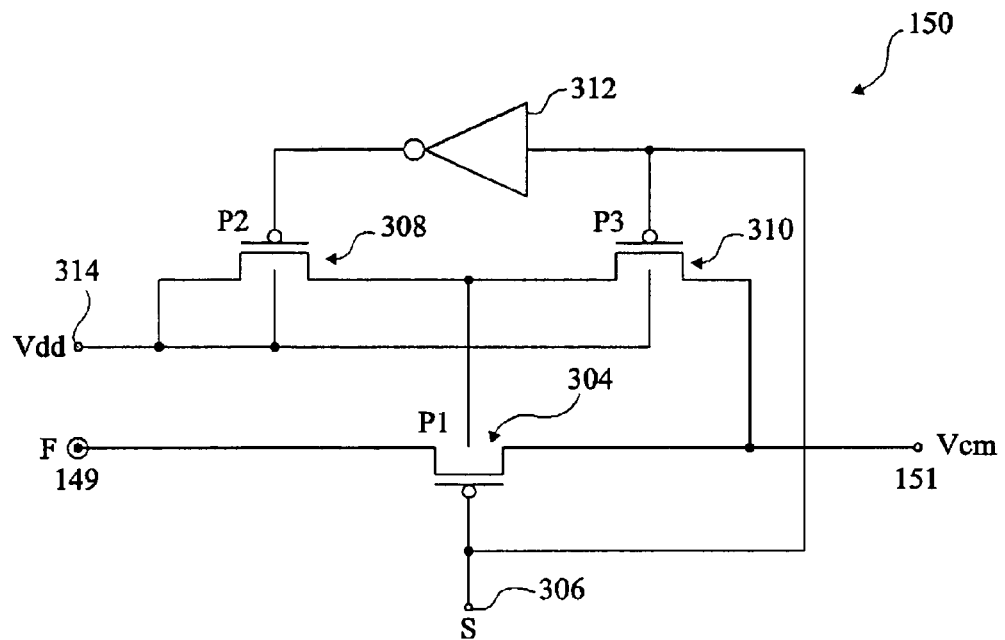
FIGS. 5A and 5B illustrate the feedback switches of FIG. 3 in more detail according to one embodiment.

With reference to FIG. 5A, switch 150 comprises a first node 149, which is the node positioned between the resistor 146 and the switch 148 in the feedback path. It also comprises an output node 151, which is connected to $V_{cm}$ at node 110 as shown in FIG. 3. The switch comprises a PMOS transistor 304, with a first of its source/drain nodes connected to node 149 and its other source/drain node connected to node 151. Its gate is connected to an input signal on line 306 which controls the PMOS transistors. The well of the PMOS transistor 304 is selectively connected to the supply voltage $V_{dd}$ or to $V_{cm}$ based on the control signal on line 306 which controls further PMOS transistors 308 and 310. PMOS transistors 308 and 310 are connected in series between the common node voltage 151 of the switch and the supply voltage $V_{dd}$ 314, a first source/drain node of PMOS transistor 310 being connected to node 151, the other source/drain node of PMOS transistor 310 being connected to a first source/drain node of PMOS transistor 308, and the other source/drain node of PMOS transistor 308 being connected to supply voltage $V_{dd}$ at node 314. The well of PMOS transistor 304 is connected to the junction between PMOS transistor 310 and PMOS transistor 308, and the gate of PMOS transistor 310 is connected to the input switch signal 306. The gate of PMOS transistor 308 is connected to the input switch signal 306 via an inverter 312. The wells of PMOS transistors 308 and 310 are connected to the supply voltage $V_{dd}$.

In operation, the switch of FIG. 5A operates as follows. When the feedback path is connected, switch 150 is turned off by controlling the input signal on line 306 to be high, such that PMOS transistor 304 is turned off. The same input signal on line 306 will turn off PMOS transistor 310 and turn on PMOS transistor 308, thus connecting the well of transistor 304 to the supply voltage $V_{dd}$ on line 314.

Conversely, when the feedback path is to be disconnected, switch 150 is turned on by controlling the signal on line 306 to be low, such that PMOS transistor 304 is turned on and conducts. PMOS transistor 310 is also turned on, but PMOS transistor 308 is turned off, thereby connecting the well of PMOS transistor 304 to $V_{cm}$ node 151.

Thus the well of PMOS transistor 304 is connected to $V_{cm}$ when node 149 is connected to $V_{cm}$, avoiding any voltage across the parasitic capacitance between the well and node 149. However, when PMOS transistor 304 is non-conducting, node 149 is connected to the output of the amplifier, which can vary between 0V and $V_{dd}$, and then the well of PMOS transistor 304 is connected to $V_{dd}$ at node 314.

Figure 5B:
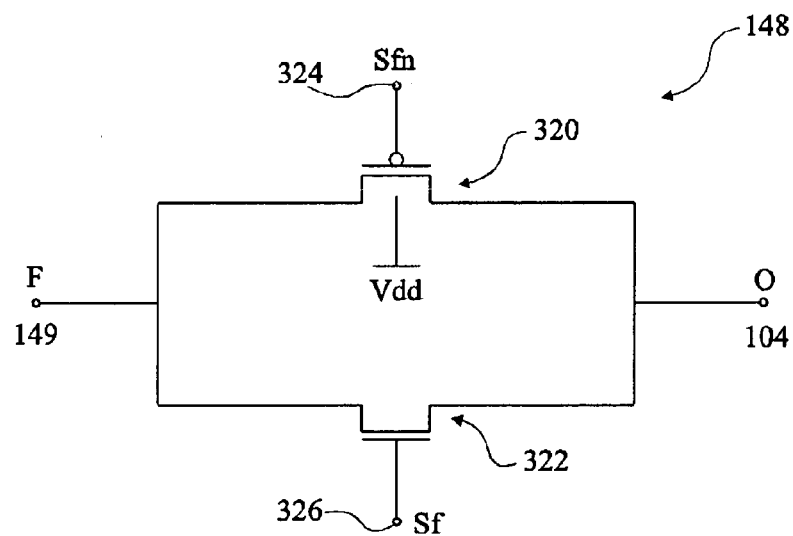

FIG. 5B illustrates switch 148 of FIG. 3 in more detail, which is identical to switch 156.

Referring to FIG. 5B, switch 148 comprises an input node 149, an output node 104 and a P-channel MOS transistor 320 in parallel with an N-channel MOS transistor 322. The first and second source/drain nodes of NMOS transistor and PMOS transistor 320, 322 are connected to input node 149 and output node 104 respectively. NMOS transistor 322 receives a first control signal on line 326 at its gate node, and PMOS transistor 320 receives a second control signal on line 324 at its gate node, the second control signal being the inverse of the first control signal on line 326. The well of PMOS transistor 320 is connected to the supply voltage $V_{dd}$.

In operation, when the control signal on line 326 is high, and the control signal on line 324 is low, both NMOS transistor 322 and PMOS transistor 320 conduct, thus connecting node 149 to the output node 104, and connecting the feedback path. Conversely, when the control signal on line 326 is low, and the control signal on line 324 high, both PMOS transistor 320 and NMOS transistor 322 are turned off, thus isolating node 300 from node 104, and disconnecting the feedback path.

Figure 6:
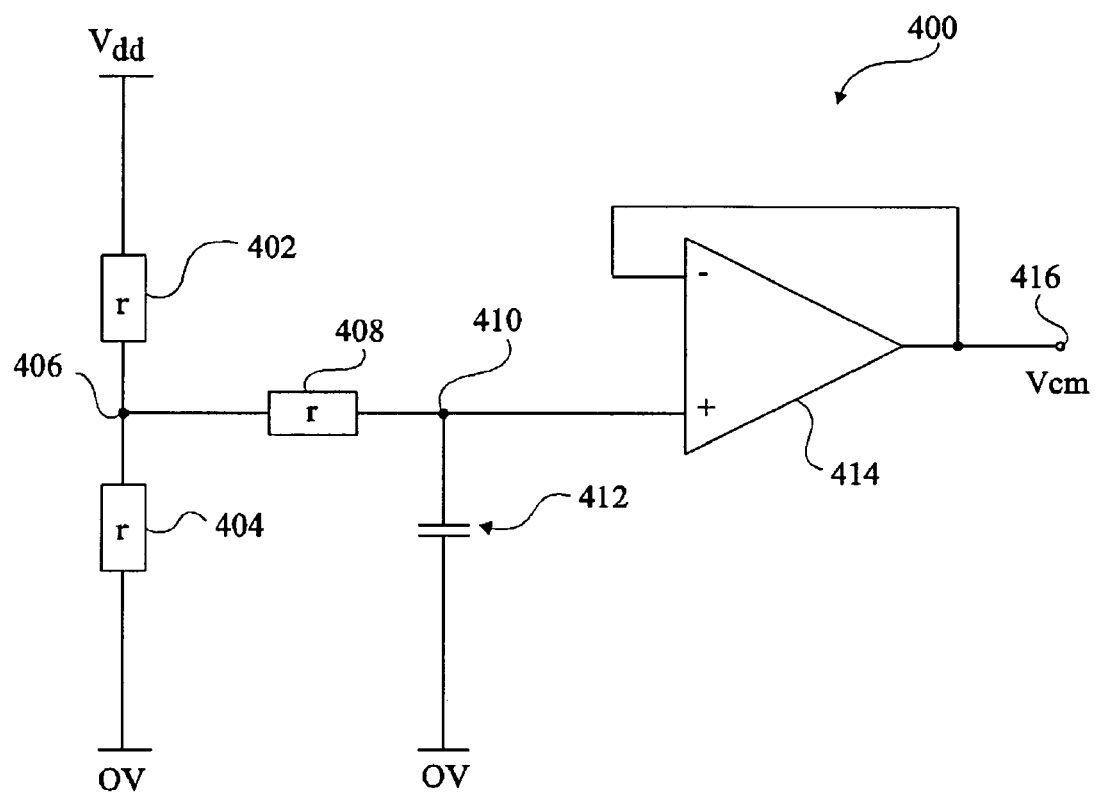
FIG. 6 illustrates a circuit for generating a common mode voltage reference.

FIG. 6 shows a circuit 400 for generating the clean common mode voltage reference $V_{cm}$. The circuit comprises a pair of resistors 402, 404 of equal resistance connected in series between the supply voltage $V_{dd}$ and a ground voltage at 0V. A node 406 between resistors 402, 404 is connected to a further resistor of approximately 2 MΩ which is in turn connected to a node 410. Node 410 is connected to the ground voltage at 0V via a capacitor 412 of approximately 1 μF. Node 410 is also connected to the positive differential input terminal of an operational amplifier 414. The output of operational amplifier 414 provides the clean reference voltage $V_{cm}$ at node 416. Node 416 is also connected to the negative differential input terminal of the operational amplifier 414, providing a feedback path.

The circuit of FIG. 6 operates as follows. The pair of resistors 402, 404 form a resistor divider that provides a voltage at node 406 of approximately half the supply voltage $V_{dd}$ and this division halves any supply voltage ripples. Resistor 408 and capacitor 412 together form an RC low pass filter that then attenuates voltage ripple from the supply voltage in the audio frequency band starting at approximately 20 Hz. The operational amplifier 414 is arranged as a buffer to then buffer the filtered signal providing an output that is low impedance and stable, and which is not dependent on the load.

An alternative embodiment will now be described with reference to FIGS. 7 and 8.

Figure 7:
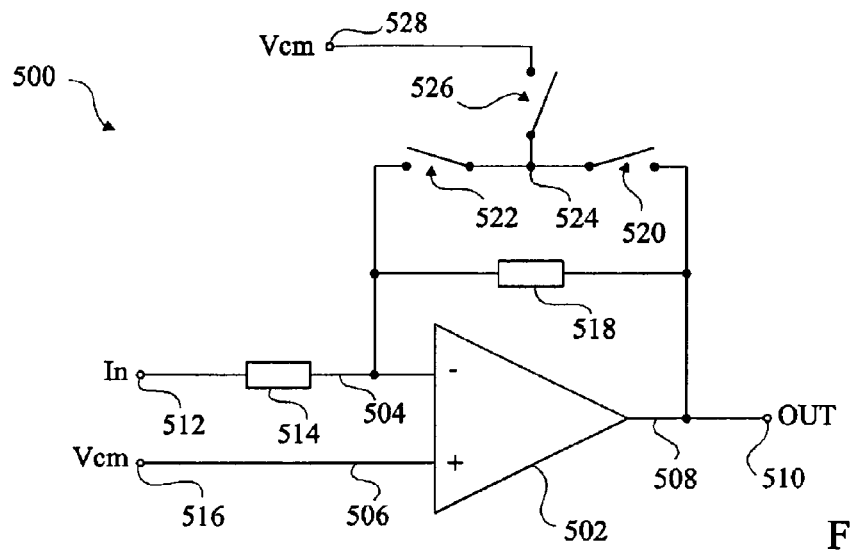
FIG. 7 illustrates an amplifying circuit according to another embodiment of the present invention.

FIG. 7 illustrates an alternative circuit arrangement that can selectively operate as an inverting amplifier or a non-inverting voltage follower. The circuit 500 comprises an operational amplifier 502 comprising first and second different inputs 504 and 506, and an output 508 connected to the output node 510 of the circuit 500. The first differential input node is a negative input node and the second differential input node is a positive input node. The circuit further comprises an input node 512 connected to the first input terminal 504 of the operational amplifier via a resistor 514. The second input terminal 506 is connected to the common mode voltage level $V_{cm}$ at node 516. $V_{cm}$ can be generated using the circuit of FIG. 6 as described above.

The circuit further comprises first and second feedback paths, a first feedback path connected between the output 508 and the negative input node 504 of the operational amplifier 502, and comprising a resistor 518, and a second feedback path also connected between output node 508 and input node 504, comprising first and second switches 520, 522 connected in series. A node 524 between the first and second switches is connected to voltage level $V_{cm}$ at a node 528 via a third switch 526.

In a first mode of operation, the first and second switches 520, 522 are controlled to connect the input node 504 directly to the output node 508 of the operational amplifier, the circuit thus functioning as a non-inverting voltage follower. In this mode the third switch 526 is open.

In a second mode of operation, the first and second switches 520, 522 are opened, thus leaving only the first feedback path with resistor 518 connected, and thus the circuit operates as an inverting amplifier. In this second mode the third switch is controlled to connect node 524 to $V_{cm}$, thereby preventing any voltage ripple caused by the first and second switches 520, 522 affecting the sensitive input node 504 of the operational amplifier.

Figure 8:
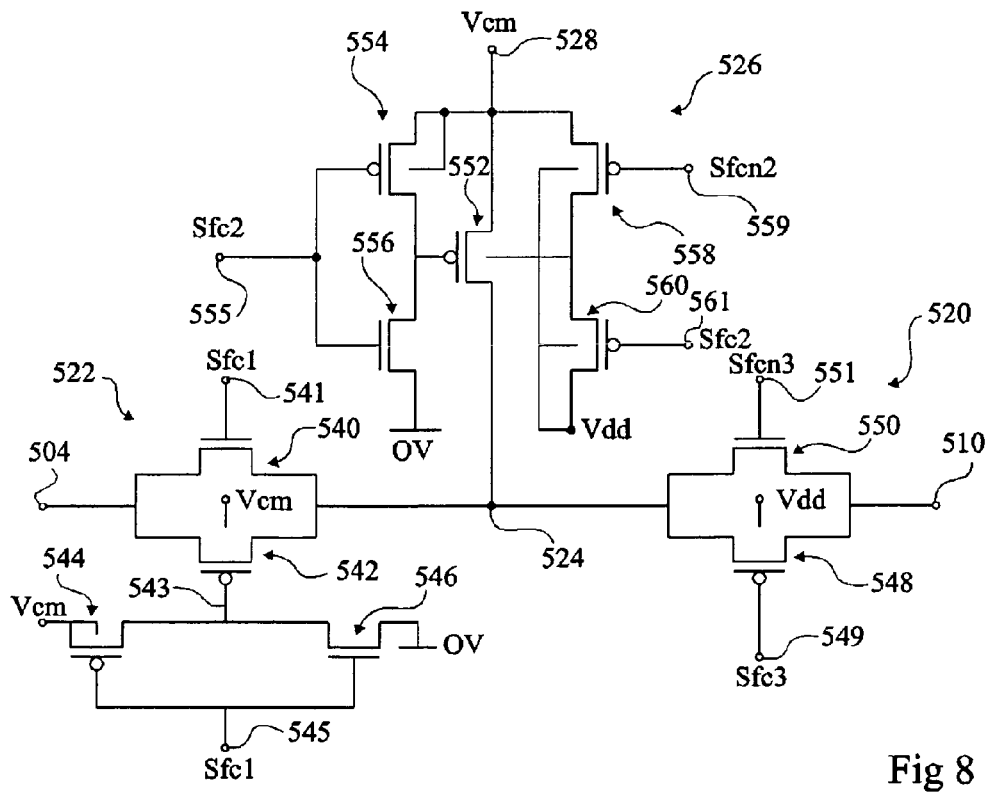
FIG. 8 illustrates switches of FIG. 7 in more detail.

FIG. 8 illustrates the first, second and third switches 520, 522 and 526 in more detail. The second switch 522 comprises a first N-channel MOS transistor 540 and a first p-channel MOS transistor 542, connected in parallel, each having a first source/drain node connected to the negative input node 504, and a second source/drain node connected to node 524. NMOS transistor 540 comprises a control terminal connected to node 541 for receiving a first control signal Sfc1. PMOS transistor 542 has its well connected to $V_{cm}$ and its control terminal connected to a node 543, which is connected to the first source/drain node of a second P-channel transistor 544 and a second N-channel transistor 546. The second source/drain node of PMOS transistor 544 is connected to $V_{cm}$ and the second source/drain node of NMOS transistor 546 is connected to 0V. The control nodes of PMOS transistor 544 and NMOS transistor 546 are connected to a node 545 for receiving the first control signal.

The third switch 526 comprises a P-channel MOS transistor 552 comprising a first source/drain node connected to node 524 and a second source/drain node connected to $V_{cm}$ at node 528. The control terminal of PMOS transistor 552 is connected to the first source/drain terminal of a P-channel MOS transistor 554 and to the first source/drain terminal of an N-channel MOS transistor 556. The second source/drain node of PMOS transistor 554 is connected to $V_{cm}$ at node 528, whilst the second source/drain terminal of NMOS transistor 556 is connected to 0V. The well connection of PMOS transistor 554 is connected to node 528, and the control terminals of both transistors 554 and 556 are connected to a node 555 for receiving a second control signal Sfc2. The well of PMOS transistor 552 is connected to the first source/drain node of first and second PMOS transistors 558, 560. The second source/drain nodes of PMOS transistors 558 and 560 are connected to $V_{cm}$ at node 528 and the supply voltage $V_{dd}$ respectively. The wells of PMOS transistors 558, 560 are connected to the supply voltage $V_{dd}$. The control terminal of PMOS transistor 560 is connected to a node 561 for receiving the second control signal Sfc2. The control terminal of PMOS transistor 558 is connected to a node 559 for receiving the inverse of the second control signal, labelled Sfcn2.

The first switch 520 comprises a P-channel MOS transistor 548 and an N-channel MOS transistor 550, connected in parallel, each having a first source/drain node connected to node 524, and a second source/drain node connected to the operation amplifier output node 510. The well of PMOS transistor 548 is connected to the supply voltage $V_{dd}$, and its control terminal is connected to a node 549 for receiving a third control signal Sfc3. The control terminal of NMOS transistor 550 is connected to a node 551 for receiving the inverse of the third control signal labelled Sfcn3.

In operation, when the zero resistance feedback path is to be connected, the first control signal is high, turning on NMOS transistor 540, and controlling transistors 544 and 546 to connect the control terminal of PMOS transistor 542 to 0V, thus turning on PMOS transistor 542. The third control signal is low, for example at 0V, turning on PMOS transistor 548, and the inverse of this signal will turn on NMOS transistor 550. In this mode the third switch 526 should not conduct, however, as node 524 is effectively connected to $V_{cm}$ at the negative input terminal 504 of the operational amplifier, it is sufficient to connect the control terminal of PMOS transistor 552 to $V_{cm}$ by providing the second control signal low, for example at 0V. In this mode the well of PMOS transistor 552 is connected to the supply voltage $V_{dd}$ by providing a low signal to the control terminal of PMOS transistor 560 and a high signal to the control terminal of PMOS transistor 558.

If the zero resistance feedback path is to be disconnected, the first control signal at nodes 545 and 541 will be low, thus turning of NMOS transistor 540. Likewise, the third control signal at node 549 and its inverse at node 551 will be high and low respectively, turning off transistors 550 and 548.

PMOS transistor 552 is turned on by providing the second control signal at node 555 high, thereby controlling NMOS transistor 556 to connect the control terminal of PMOS transistor 552 to 0V. In this mode the well of PMOS transistor 552 is connected to $V_{cm}$ by providing a high signal at node 561 and a low signal at node 559.

Thus switch circuit configurations have been described that reduce the effect of parasitic capacitances in the switches, thus increasing the PSRR at the output of an amplifier system. According to some embodiments this is achieved by connecting the node of a switch that is connected to a sensitive node to a clean voltage supply. This prevents any voltage ripple caused by parasitic capacitances in the switch affecting the sensitive node. By sensitive node it is meant a node at which noise will undesirably affect the output of the circuit, and for example is the input node of an amplifier. Some embodiments additionally or alternatively comprise a switch arranged to reduce the effect of parasitic capacitances, and in particular comprise a transistor that with an inverter connected to its control terminal. The inverter translates a control signal variable between 0V and the supply voltage to a control signal variable between a clean voltage supply and 0V, thus preventing supply voltage ripples affecting the transistor. Whilst the clean voltage supply does not completely turn off the transistor, in many situations this is sufficient. For example, when both main terminals of the transistor are connected to approximately the same voltage level, which is the case when these node are connected between the input nodes of an operational amplifier, the transistor will be sufficiently turned off.

Whilst a number of embodiments have been described above, it will be apparent to those skilled in the art that there are numerous variations that can be applied.

Whilst FIG. 6 provides an example of a circuit for producing a clean voltage supply, there are alternative circuits that could be used to generate such a clean supply voltage, and the supply voltage could be at a voltage level different from half of the supply voltage $V_{dd}$.

Whilst the switches have been described using a few particular example embodiments of an inverting amplifier, in alternative embodiments the switches could be included in other circuits, such as digital to analogue converters, or alternative amplifiers. Furthermore, the switches may be included in a variety of audio device as part of an audio integrated circuit. The audio devices could include mobile phones, PDAs (personal digital assistants), laptop or personal computers etc.

Whilst the switch of FIG. 4 includes N-channel transistors 208 and 212 in parallel with the PMOS transistors, in alternative embodiments, these transistors are not necessary. Whilst transistor 222 provides added capacitance cancellation, in alternative embodiments such a transistor is not provided. The resistor 145 shown in FIG. 3 enables voltage at node 108 resulting from the parasitic capacitances of NMOS transistor 222, that cancels PSRR caused by NMOS transistor 212. However, in embodiments in which NMOS transistor 222 is not provided, resistor 145 is not required.

The advantageous features described herein have been described in relation to a few example embodiments comprising particular combinations of these features, but it will be apparent to those skilled in the art that these features can be combined in any combination.

Having thus described at least one illustrative embodiment of the invention, various alterations, modifications and improvements will readily occur to those skilled in the art. Such alterations, modifications and improvements are intended to be within the scope of the invention. Accordingly, the foregoing description is by way of example only and is not intended to be limiting. The invention is limited only as defined in the following claims and the equivalents thereto.

What is claimed is:
1. A switch comprising:
a first transistor comprising a first main terminal connected to a first switch node, a second main terminal connected to a second switch node and a first control terminal, the second switch node being connected to a first clean voltage supply;
first control means connected to said first control terminal of said first transistor, comprising a first node connected to said first clean voltage supply, a second node connected to a second voltage level, and a first control input node for receiving a first input control signal variable between a supply voltage level and a third voltage level, said first control means comprising two series-connected transistors and being arranged to selectively connect said first control terminal of said first transistor to one of said first and second nodes based on said first input control signal, wherein coupled main terminals from each of the series-connected transistors apply voltage to the first control terminal and the first transistor and first control means are configured to reduce effects of parasitic capacitance from at least the first transistor in the switch;
a second transistor comprising a third main terminal connected to said first switch node, a fourth main terminal connected to a third switch node, and a second control terminal, said third switch node connected to a first differential input node of an amplifier; and second control means connected to said second control terminal of said second transistor, said second control means comprising a third node connected to said first clean voltage supply, a fourth node connected to said second voltage level, and a second control input node for receiving a second input control signal variable between said supply voltage level and said third voltage level, said second control means arranged to selectively connect said second control terminal of said second transistor to one of said third and fourth nodes of said second control means based on said second input control signal.

2. The switch of claim 1 wherein said first transistor is a P-channel transistor.

3. The switch of claim 1 wherein said first switch node is connected to the first differential input node of the amplifier.

4. The switch of claim 3 wherein said amplifier is an operational amplifier further comprising a second differential input node connected to said first clean voltage supply.

5. The switch of claim 1 further comprising a third transistor comprising a fifth main terminal connected to said second switch node, a sixth main terminal connected to the first switch node, and a third control terminal, said first switch node connected to the first differential input node of the amplifier.

6. The switch of claim 1 wherein said first and second transistors are P-channel transistors each comprising a well terminal connected to said first clean voltage supply.

7. The switch of claim 1 wherein said first control means comprises an inverter.

8. The switch of claim 1 wherein said first control means comprises a third transistor comprising a fifth main terminal connected to said first clean voltage supply, a sixth main terminal connected to the first control terminal of said first transistor, and a third control terminal arranged to receive said first input control signal, and a fourth transistor comprising a seventh main terminal connected to the first control terminal of said first transistor, an eighth main terminal connected to said second voltage level, and a fourth control terminal arranged to receive said first input control signal.

9. The switch of claim 1 further comprising a third transistor comprising a fifth main terminal connected to said first switch node, a sixth main terminal connected to said third switch node, and a third control terminal arranged to receive said second input control signal.

10. The switch of claim 9 further comprising a fourth transistor comprising a fourth control terminal connected to the third control terminal of said third transistor, and seventh and eighth main terminals connected to a second differential input node of the amplifier, said second differential input node connected to said clean voltage supply via a first resistor.

11. An amplifying circuit comprising:
at least one switch as claimed in claim 1 connected to the amplifier; and
a plurality of input paths to the amplifier, each path comprising at least one resistor, wherein the at least one switch is configured to selectively connect at least one of the plurality of input paths to the amplifier.

12. An audio device comprising a switch comprising:
a first transistor comprising a first main terminal connected to a first switch node, a second main terminal connected to a second switch node and a first control terminal, the second switch node being connected to a first clean voltage supply;
first control means connected to said first control terminal of said first transistor, comprising a first node connected to said first clean voltage supply, a second node connected to a second voltage level, and a first control input node for receiving a first input control signal variable between a supply voltage level and a third voltage level, said first control means comprising two series-connected transistors and being arranged to selectively connect said first control terminal of said first transistor to one of said first and second nodes based on said first input control signal, wherein coupled main terminals from each of the series-connected transistors apply voltage to the first control terminal and the first transistor and first control means are configured to reduce effects of parasitic capacitance from at least the first transistor in the switch;
a second transistor comprising a third main terminal connected to said first switch node, a fourth main terminal connected to a third switch node, and a second control terminal, said third switch node connected to a first differential input node of an amplifier; and
second control means connected to said second control terminal of said second transistor, said second control means comprising a third node connected to said first clean voltage supply, a fourth node connected to said second voltage level, and a second control input node for receiving a second input control signal variable between said supply voltage level and said third voltage level, said second control means arranged to selectively connect said second control terminal of said second transistor to one of said third and fourth nodes of said second control means based on said second input control signal.

13. The switch of claim 12, wherein the first input control signal is variable between a supply voltage level and a third voltage level.

14. A switch comprising:
a first transistor comprising a first main terminal connected to a first switch node, a second main terminal connected to a second switch node and a first control terminal, the second switch node configured to connect to a first voltage supply;
a controller connected to said first control terminal of said first transistor, comprising a first node configured to connect to said first voltage supply, a second node configured to connect to a second voltage level, and a first control input node for receiving a first input control signal, said controller comprising two series-connected transistors and being adapted to selectively connect said first control terminal of said first transistor to one of said first and second nodes based on said first input control signal, wherein coupled main terminals from each of the series-connected transistors applies voltage to the first control terminal and the first transistor and controller are configured to reduce effects of parasitic capacitance from at least the first transistor in the switch;
a second transistor comprising a third main terminal connected to said first switch node, a fourth main terminal connected to a third switch node, and a second control terminal, said third switch node configured to connect to a first differential input node of an amplifier; and
a second controller connected to said second control terminal of said second transistor, said second controller comprising a third node configured to connect to said first voltage supply, a fourth node configured to connect to said second voltage level, and a second control input node for receiving a second input control signal, said second controller arranged to selectively connect said second control terminal of said second transistor to one of said third and fourth nodes of said second controller based on said second input control signal.

15. The switch of claim 14 further comprising a third transistor comprising a fifth main terminal connected to said second switch node, a sixth main terminal connected to the first switch node, and a third control terminal, said first switch node configured to connect to the first differential input node of the amplifier.

16. The switch of claim 14 further comprising a third transistor comprising a fifth main terminal connected to said first switch node, a sixth main terminal connected to said third switch node, and a third control terminal arranged to receive said second input control signal.

17. The switch of claim 16 further comprising a fourth transistor comprising a fourth control terminal connected to the third control terminal of said third transistor, and seventh and eighth main terminals configured to connect to a second differential input node of the amplifier.

18. The switch of claim 14, wherein the first input control signal is variable between a supply voltage level and a third voltage level.

19. The switch of claim 17, further comprising circuitry to connect the second differential input node to the first voltage supply via at least one resistor.

* * * * *